United States Patent
Wada

(10) Patent No.: US 8,170,093 B2
(45) Date of Patent: May 1, 2012

(54) EQUALIZING FILTER CIRCUIT

(75) Inventor: Shigeki Wada, Tokyo (JP)

(73) Assignee: NEC Corporation, Tokyo (JP)

( * ) Notice: Subject to any disclaimer, the term of this patent is extended or adjusted under 35 U.S.C. 154(b) by 566 days.

(21) Appl. No.: 12/439,139

(22) PCT Filed: Aug. 24, 2007

(86) PCT No.: PCT/JP2007/066460
§ 371 (c)(1),
(2), (4) Date: Feb. 26, 2009

(87) PCT Pub. No.: WO2008/029643
PCT Pub. Date: Mar. 13, 2008

(65) Prior Publication Data
US 2009/0262796 A1    Oct. 22, 2009

(30) Foreign Application Priority Data
Aug. 31, 2006   (JP) .................................. 2006-235520

(51) Int. Cl.
*H03H 7/30*   (2006.01)
(52) U.S. Cl. ........ 375/232; 375/229; 375/230; 375/233; 375/350; 333/318; 333/328 R; 708/300
(58) Field of Classification Search .................. 375/229, 375/230, 232, 233, 350; 333/318, 328 R; 708/300
See application file for complete search history.

(56) References Cited

U.S. PATENT DOCUMENTS
2004/0012433 A1 *   1/2004   Kim et al. ..................... 327/350

FOREIGN PATENT DOCUMENTS

| JP | 1992233313 A | 8/1992 |
|----|--------------|--------|
| JP | 1993136641 A | 6/1993 |
| JP | 1995067061 B | 7/1995 |
| JP | 1999355099 A | 12/1999 |
| JP | 2003258606 A | 9/2003 |

OTHER PUBLICATIONS

International Search Report for PCT/JP2007/066460 mailed Dec. 4, 2007.
H. Wu, et al., "Differential 4-tap and 7-tap Transverse Filters in SiGe for 10 Gb/s Multimode Fiber Optic Link Equalization", International Solid-State Circuit Conference (ISSCC) 2003, Preliminary Summary, Paper 10.4.
Assaad Borjak, et al., "High-Speed Generalized Distributed Amplifier-Based Transversal-Filter Topology for Optical Communication Systems," A. Borjak, et al., IEEE Trans. Microwave Theory Tech., vol. 45, No. 8, pp. 1453-1457.

* cited by examiner

*Primary Examiner* — Leon Flores

(57) ABSTRACT

An equalizing filter circuit includes a first transmission line in which a plurality of first delay devices 104a are connected in cascade to input terminal 101, a second transmission line in which a plurality of second delay devices 107a are connected in cascade to output terminal 102, a plurality of weighting circuits 105a connected in parallel between the first transmission line and the second transmission line and having a gain which is adjustable by setting coefficients, and variable adjusting circuit 108a arranged at the output side of at least one of weighting circuits 105a for correcting a fluctuation of the output characteristics of the weighting circuits.

11 Claims, 9 Drawing Sheets

EQUALIZING FILTER CIRCUIT

This application is the National Phase of PCT/JP2007/066460, filed Aug. 24, 2007, and is based upon and claims the benefit of priority from Japanese Patent Application No. 2006-235520, filed on Aug. 31, 2006, the disclosure of which is incorporated herein in its entirety by reference.

TECHNICAL FIELD

The present invention relates to a signal processing circuit, and more particularly, to an equalizing filter circuit, which compensates for distortion of a signal waveform generated in a transmission medium, in an optical communication using an optical fiber, in a telecommunication using wires, and in a wireless communication.

BACKGROUND ART

In a variety of transmission systems, a weighted and delayed equalizing filter circuit is frequently employed as a technological means for electrically compensating for waveform distortions that are generated due to dispersion or loss in a transmission medium.

FIG. 1 is a circuit block diagram of a conventional weighted and delayed equalizing filter circuit. The circuit in question is often called a transversal filter, a finite impulse response (FIR) digital filter, or a feed forward equalizer.

This type of circuit has been described in, for example, the literature ("High-Speed Generalized Distributed Amplifier-Based Transversal-Filter Topology for Optical Communication Systems," A. Borjak, et al., IEEE Trans. Microwave Theory Tech., Vol. 45, No. 8, pp. 1453-1457).

As shown in FIG. 1, such a transversal filter consists of n-delay devices 1105 and n-weighting circuits 1106 wherein n is an integer equal to or greater than 2. A signal inputted to the transversal filter is set to a desired delay by the respective delay devices 1105 to be outputted as the respective output signals. Then, desired weight values (filter coefficient) are given by the respective weighting circuits 1106. Thereafter, the signals from weighting circuits are added together to be eventually outputted. By performing this kind of signal processing, waveform equalizing is realized by directly compensating for a waveform distortion in an electric signal as well as by carrying out photoelectric conversion of an optical dispersion waveform by a photodiode or the like, followed by correction in optical communications.

FIG. 2 is a circuit block diagram illustrating an exemplified configuration of a transversal filter circuit. A conventional transversal filter circuit of this type has been described in, for example, the literature ("Differential 4-tap and 7-tap Transverse Filters in SiGe for 10 Gb/s Multimode Fiber Optic Equalization", International Solid-State Circuit Conference (ISSCC) 2003, Preliminary Summary, Paper 10.4). As discussed in this literature, this transversal filter circuit is configured as follows using a distribution-type circuit in order to implement the above waveform equalizing function.

In such a transversal filter circuit, a 50-ohm matching transmission line connected in cascade to the input and output terminals forms delay devices 407, amplifiers each attached with a gain-adjusting terminal for setting a filter coefficient, which are installed at portions corresponding to respective amplifying stages, form weighting circuits 408, and a 50-ohm load resistance connected to output-side delay devices 409 forms an adder, to thereby constitute the transversal filter circuit. According to this circuit configuration, an input signal is given delays and weighting values so that desired waveform equalization can be achieved.

DISCLOSURE OF THE INVENTION

As mentioned above, in the transversal filter circuit, as an example of the equalizing filter circuit, it is customary that the transmission line be used as delay devices employing a distribution-type amplifier, and the amplifiers attached with the gain-adjusting terminals arranged at the respective amplifying stages are used as gain-adding amplifiers in order to realize a desired equalizing function. According to this circuit configuration, the input signal is given delays and weighting components so as to achieve the desired waveform equalization. In the distribution-type amplifier which is the basis of the transversal filter, the length of the transmission line is typically optimized to attain impedance matching with the input and output load resistances of respective amplifier stages connected in parallel with each other to thereby realize the maximum gain-bandwidth product at the operating points of the respective amplifier stages.

However, the transversal filter encounters a problem in which since it uses the transmission line as the delay devices, the length of the transmission line is determined depending on the delay time, for which reason the circuit configuration that uses impedance matching through optimization of the transmission line can be employed.

Furthermore, the transversal filter entails a drawback in which since the gain-weighting amplifiers thereof arbitrarily set respective weighting coefficients, the output loads of respective weighting circuits vary depending on the set coefficient values, leading to a partial change in the delay time of the delay devices, and the impedance of the transmission line is partially mismatched. That is, when the weighting coefficients of the weighting circuits are changed, the frequency characteristics and the set delay time of the delay devices are changed to make high-precision control of compensation difficult, resulting in a significant difficulty in compensation according to dynamic changes and adaptive equalization.

Accordingly, the present invention has been made to solve the above problems associated with the prior art, and it is an object of the present invention to provide an equalizing filter circuit which can suppress fluctuation of the output characteristics of the weighting circuits and the delay characteristics of the delay devices and can perform stable and high-precision compensation for signal waveform distortion although the arbitrary setting of the coefficients of the weighting circuits has been made performed.

An equalizing filter circuit according to the present invention comprises: a first transmission line in which a plurality of first delay devices are connected in cascade to an input terminal; a second transmission line in which a plurality of second delay devices are connected in cascade to an output terminal; a plurality of weighting circuits connected in parallel between the first transmission line and the second transmission line and having a gain which is adjustable by setting the coefficients; and a variable adjusting circuit arranged at the output side of at least one of the weighting circuits for correcting a fluctuation of the output characteristics of the weighting circuits.

According to the present invention, a fluctuation of the output characteristics of at least one weighting circuit by setting the coefficients is corrected by the variable adjusting circuit. If the output characteristics of the plurality of weighting circuits, including the associated weighting circuit whose output characteristics are corrected, are added, the entire fluctuation of the output characteristics of the weighting circuits is further suppressed.

According to the present invention, the variable adjusting circuit performs the operation of canceling a fluctuation of an output load of an amplifier of the weighting circuit that occurs when the coefficient of the amplifier is changed so that a change of the delay time of the delay devices or an impedance mismatch can be suppressed. As a result, performing stable and high-precision compensation control for signal waveform distortion is realized so that an adaptive equalization according to dynamic waveform distortion becomes easier.

Figure 1:
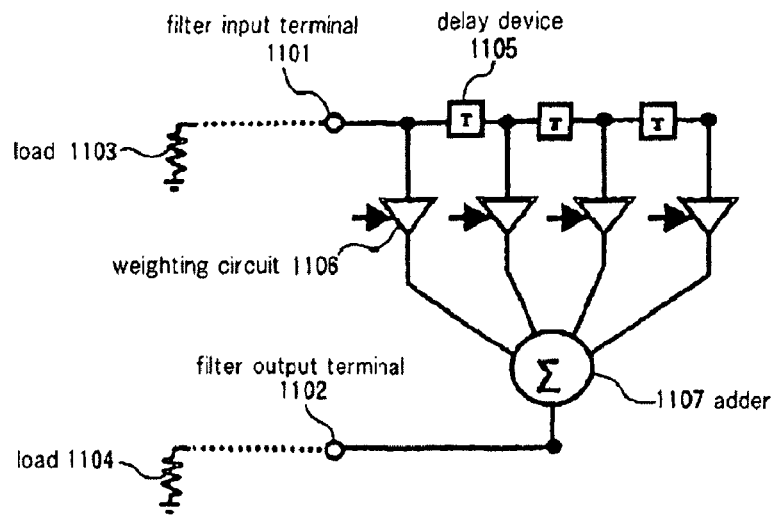
FIG. 1 is a circuit block diagram illustrating an example of a configuration of an equalizing filter circuit.

| Description of reference characters: | |
|---|---|
| 101 | filter input terminal |
| 102 | filter output terminal |
| 104a-104e | delay devices |
| 105a-105e | weighting circuits |
| 106 | coefficient-setting terminal |
| 107a-107e | delay devices |

BEST MODE FOR CARRYING OUT THE INVENTION

Figure 3:
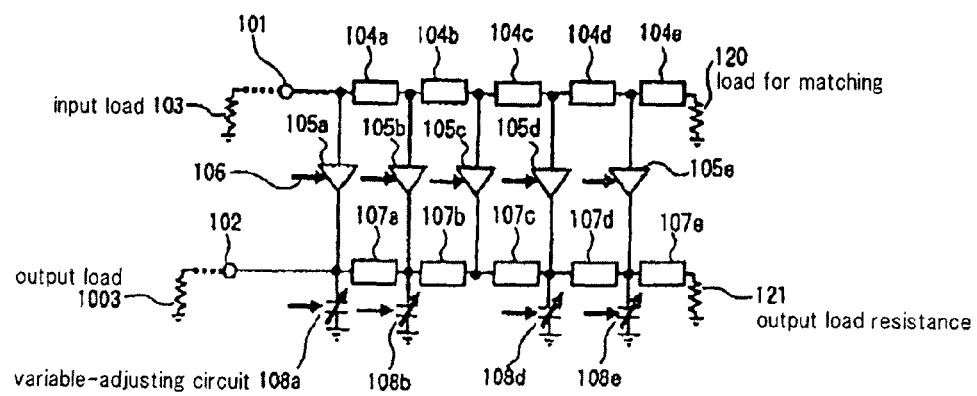
FIG. 3 is a circuit block diagram illustrating one example of a configuration of an equalizing filter circuit according to an exemplary embodiment of the present invention.

The configuration of the equalizing filter circuit according to the exemplary embodiment of the present invention will be described hereinafter. FIG. 3 is a circuit block diagram illustrating one example of a configuration of an equalizing filter circuit according to an exemplary embodiment of the present invention.

As shown in FIG. 3, the equalizing filter circuit according to the exemplary embodiment of the present invention includes a plurality of delay devices $104a$ to $104e$ connected in cascade to filter input terminal 101, a plurality of weighting circuits $105a$ to $105e$ having an adjustable gain, and a plurality of delay devices $107a$ to $107e$ connected in cascade to filter output terminal 102. Also, variable adjusting circuits $108a$, $108b$, $108d$ and $108e$ are connected to the output sides of weighting circuits $105a$, $105b$, $105d$ and $105e$, respectively. Each variable adjusting circuit includes a variable capacitance element.

Each of weighting circuits $105a$ to $105e$ is provided with a coefficient-setting terminal 106 for setting a weighting coefficient. Input load 103 is connected to filter input terminal 101, and output load 1003 is connected to filter output terminal 102. In addition, delay device $104e$ is grounded via a load 120 for matching, and delay devices $107e$ are grounded via output load resistance 121.

In the meantime, herein, the delay devices, the weighting circuits and the delay devices are provided in five pairs, but are not limited thereto. As well, the weighting circuit is also called a tap. A line extending from filter input terminal 101 to load 120 for matching is called a first transmission line, and a line extending from filter output terminal 102 to output load resistance 121 is called a second transmission line.

In this exemplary embodiment, through the input from each coefficient-setting terminal 106 of weighting circuits $105a$ to $105e$, a gain of an amplifier of weighting circuit $105c$ is set to be greater than the gains of amplifiers of the other weighting circuits, and thus the variation width of the gains is large. As described above, the variable adjusting circuits are arranged at the output sides of four weighting circuits except for weighting circuit $105c$ so that the capacitances of the respective variable adjusting circuits are adjusted to allow the output loads of the amplifiers of all weighting circuits $105a$ to $105e$ to be equal to each other.

In the equalizing filter circuit of this exemplary embodiment, a variable adjusting circuit including a variable capacitance element is arranged at the output side of at least one of the plurality of weighting circuits. For this reason, the capacitance of the variable adjusting circuit can be adjusted to cancel the fluctuation of the output load of the weighting circuits by setting an arbitrary coefficient. Thus, although the coefficient of the weighting circuits is changed, stable output characteristics and delay characteristics can be obtained through adjustment of the capacitance of the variable adjusting circuit, thereby allowing the equalizing filter circuit to realize stable and high-precision compensation characteristics.

Further, in the equalizing filter circuit shown in FIG. 3, the variable adjusting circuits are arranged at the output sides of the remaining weighting circuits except for the weighting circuit in which there occurs a greater fluctuation of the output load, but the variable adjusting circuit may be arranged only at the output side of the weighting circuit in which there occurs a greater fluctuation of the output load according to the amount of difference between the coefficients set so as to adjust the output load. In this case, reduction of the circuit scale and ease of the adjustment of the output load can be simultaneously realized.

Figure 4:
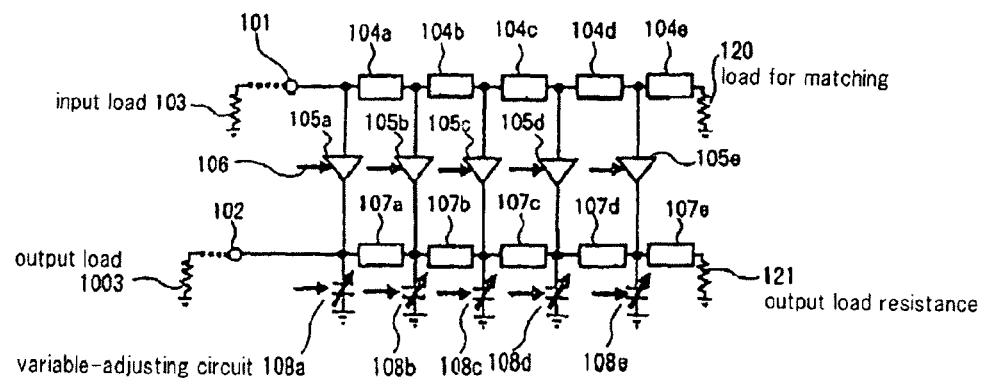
FIG. 4 is a circuit block diagram illustrating another example of a configuration of an equalizing filter circuit according to an exemplary embodiment of the present invention.

FIG. 4 is a circuit block diagram illustrating another example of a configuration of an equalizing filter circuit according to an exemplary embodiment of the present invention.

As shown in FIG. 4, variable adjusting circuit 108c is also arranged at the output side of weighting circuit 105c of the equalizing filter shown in FIG. 3. As a result, the variable adjusting circuits are arranged at the output sides of the respective weighting circuits. In this case, despite an increase in the circuit scale or the number of variable adjustments, the equalizing filter has an effect in which the adjustable range of the variable adjusting circuit is further widened.

Now, the examples of the equalizing filter circuit of the present invention will be described hereinafter.

The First Example

In this example, the variable adjusting circuit adjusts the output load of the weighting circuits through the operation thereof in response to changing the coefficient of the weighting circuits.

The configuration of the equalizing filter circuit according to this example will be described hereinafter. In the meantime, the same elements as those in the configuration shown in FIG. 3 are denoted by the same reference numerals, and a detailed description of the configuration will be omitted.

Figure 5:
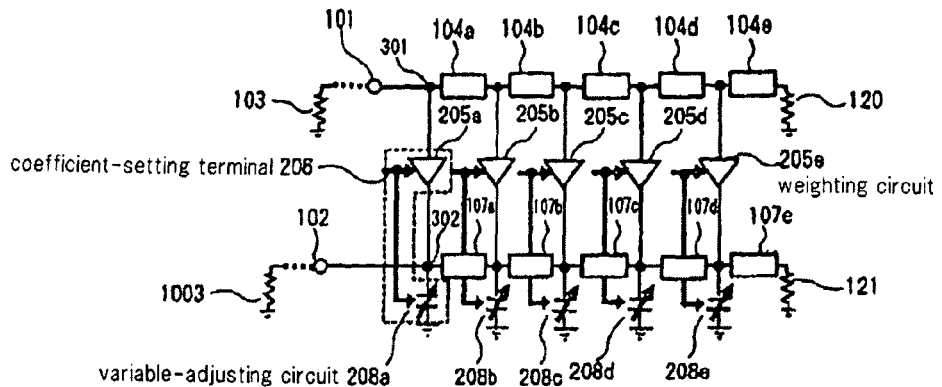
FIG. 5 is a circuit block diagram illustrating a configuration of an equalizing filter circuit according to a first example of the present invention.

FIG. 5 is a circuit block diagram illustrating a configuration of an equalizing filter circuit according to a first example of the present invention.

As shown in FIG. 5, the equalizing filter circuit according to the first example of the present invention includes a plurality of delay devices 104a to 104e connected in cascade to filter input terminal 101, a plurality of weighting circuits 205a to 205e having an adjustable gain, and a plurality of delay devices 107a to 107e connected in cascade to filter output terminal 102. Also, variable adjusting circuits 208a to 208e each including a varactor element as a variable capacitance element are connected to weighting circuits 205a to 205e, respectively. Each of weighting circuits 105a to 105e is provided with coefficient-setting terminal 206 for setting the value of a weighting coefficient.

Figure 6:
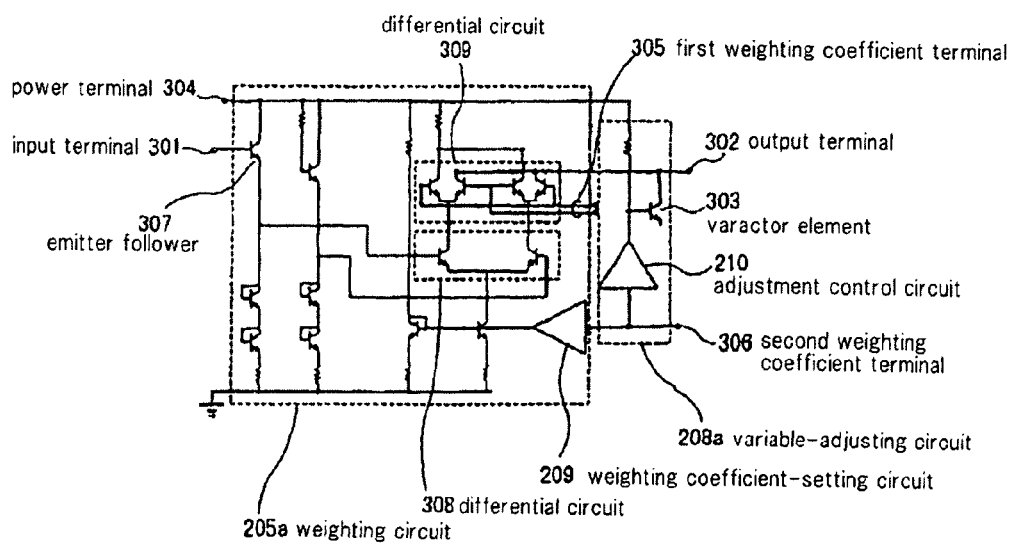
FIG. 6 is a circuit diagram illustrating an example of a configuration of a weighting circuit and a variable adjusting circuit in the equalizing filter circuit according to the first example of the present invention.

FIG. 6 is a circuit diagram illustrating an example of a configuration of a weighting circuit and a variable adjusting circuit in the equalizing filter circuit according to the first example of the present invention, which corresponds to the portion encircled by a dot line of FIG. 5. In this example, weighting circuit 205a and variable adjusting circuit 208a are described as representative examples of weighting circuits and the variable adjusting circuit.

As shown in FIG. 6, weighting circuit 205a includes emitter follower 307, differential circuits 308 and 309 connected in cascade, and weighting coefficient-setting circuit 209. Variable adjusting circuit 208a includes varactor element 303 and adjustment control circuit 210. Input terminal 301 is connected to a transmission line having filter input terminal 101, and output terminal 302 is connected to the transmission line of filter output terminal 102 side.

Coefficient-setting terminal 206 shown in FIG. 5 corresponds to first weighting coefficient terminal 305 and second weighting coefficient terminal 306 shown in FIG. 6. Weighting coefficient-setting circuit 209 and adjustment control circuit 210 are pre-set in such a fashion that weighting coefficient-setting circuit 209 adjusts the gain of an amplifier for a weighting coefficient value inputted from second weighting coefficient terminal 306, and adjustment control circuit 210 corrects the output characteristics of the weighting circuits to adjust the output load of the weighting circuits. In case where weighting coefficient-setting circuit 209 increases the gain of the amplifier by the weighting coefficient value inputted from second weighting coefficient terminal 306, adjustment control circuit 210 controls varactor element 303 to decrease the output load of the weighting circuits. On the other hand, in cases where weighting coefficient-setting circuit 209 decreases the gain of the amplifier by the weighting coefficient value inputted from second weighting coefficient terminal 306, adjustment control circuit 210 controls varactor element 303 to increase the output load of the weighting circuits.

Figure 7A:
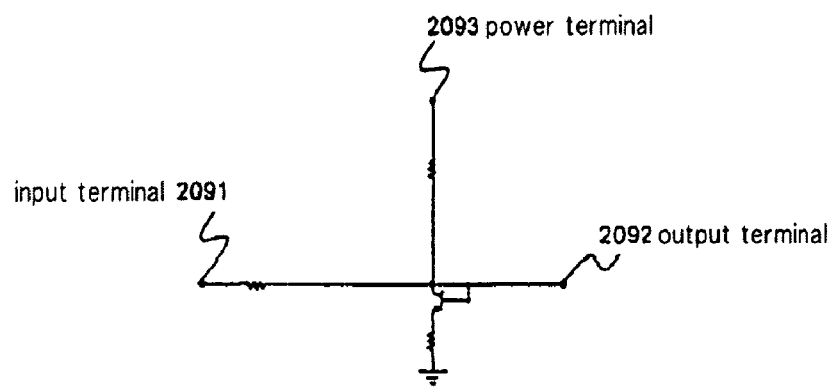
FIG. 7A is a circuit diagram illustrating an example of a configuration of a weighting coefficient-setting circuit and a variable adjusting circuit.
Figure 7B:
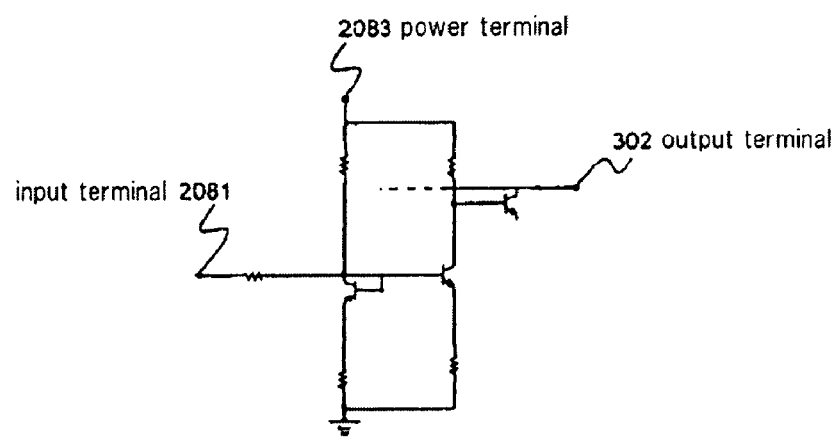
FIG. 7B is a circuit diagram illustrating an example of a configuration of a weighting coefficient-setting circuit and a variable adjusting circuit.

FIG. 7A is a circuit diagram illustrating an example of a configuration of weighting coefficient-setting circuit 209. FIG. 7B is a circuit diagram illustrating an example of a configuration of variable adjusting circuit 208a including adjustment control circuit 210. Input terminal 2091 shown in FIG. 7A is connected to second weighting coefficient terminal 306. Input terminal 2081 shown in FIG. 7B is connected to input terminal 2091 of weighting coefficient-setting circuit 209. Also, power terminal 2083 shown in FIG. 7B is connected to power terminal 304 shown in FIG. 6.

In this manner, the equalizing filter can attain remarkable effects in which the variable adjusting circuit performs the operation of canceling the fluctuation of the output load of the amplifier occurring when the coefficient of the amplifier of the weighting circuit is changed, so that a change in the delay time of the delay devices or impedance mismatching can be suppressed. As a result, stable and high-precision compensation control for signal waveform distortion is realized, and adaptive equalization according to the dynamic waveform distortion is very easily carried out.

Subsequently, the effects of the equalizing filter circuit of this example are described while being compared with the effects of an associated equalizing filter circuit. An experimental result of the equalizing filter circuit shown in FIG. 2 will be described.

Figure 2:
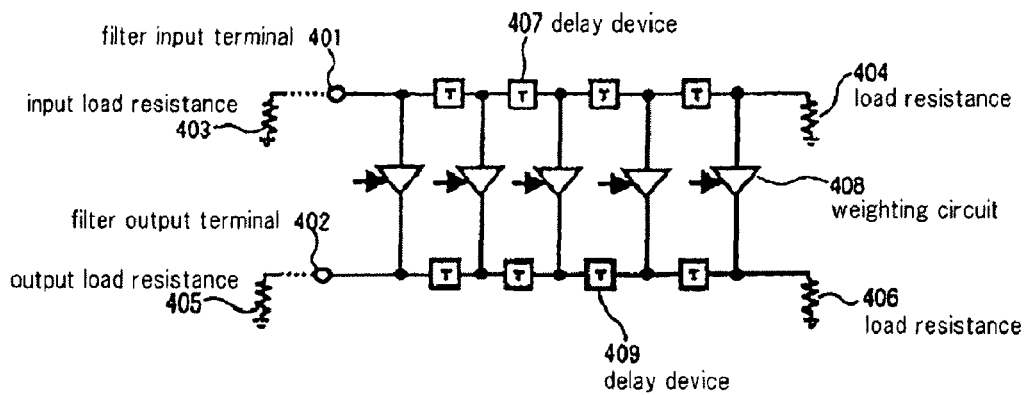
FIG. 2 is a circuit block diagram illustrating an example of a configuration of a transversal filter circuit.
Figure 8A:
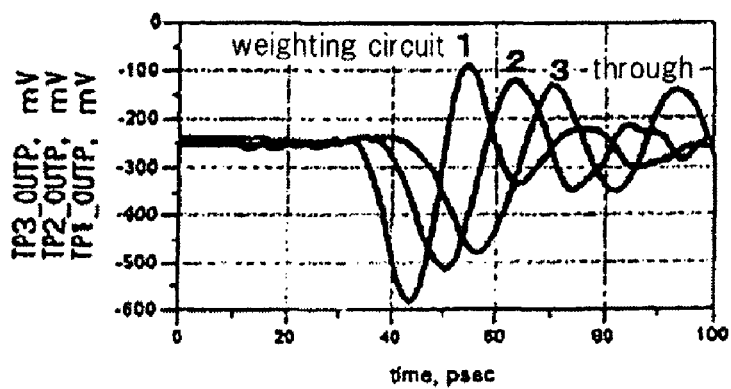
FIG. 8A is a diagrammatic view illustrating an output response of the transversal filter circuit shown in FIG. 2.
Figure 8B:
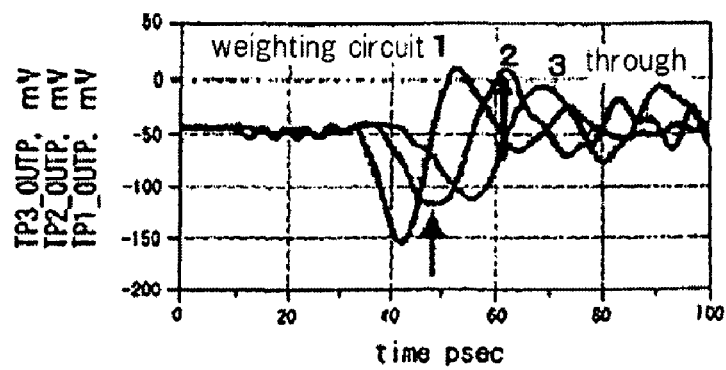
FIG. 8B is a diagrammatic view illustrating an output response of the transversal filter circuit shown in FIG. 2.

FIGS. 8A and 8B are graphs illustrating response output waveforms according to the input of pulse waveforms by an arbitrary coefficient value in the equalizing filter circuit shown in FIG. 2 wherein the abscissa denotes time and the ordinate denotes amplitude. The graphs shown in FIGS. 8A and 8B represent the response output waveforms of the first to third weighting circuits at the side adjacent to the filter input terminal. In the meantime, in the measurements shown FIGS. 8A and 8B, the delay time of the delay devices between the respective weighting circuits is set to be ¼ of the pulse width time of the input pulse waveforms.

FIG. 8A shows pulse response waveforms passing through the respective weighting circuits in which the coefficients were set by an arbitrarily determined value. It can be seen from the graphs shown in FIG. 8A that since the transmission line characteristics set in the delay devices and the output characteristics of the weighting circuits do not match each other, a large ringing appears in the pulse response waveforms.

FIG. 8B is a graph illustrating pulse response waveforms passing through the respective weighting circuits in which the values of coefficients were set by determined values that are different from the determined values in FIG. 8A. It can be seen from the graphs shown in FIG. 8B that since the pulse response waveforms are more scattered due to the fluctuation of the output characteristics of the weighting circuits, there occurs a significantly different waveform distortion from that in FIG. 8A in terms of the response of the waveforms, the delay time of each waveform, and the ringing characteristics. This means that the compensation result of the waveforms greatly varies depending on the selection method of setting the coefficient of the weighting circuits. Thus, it can be seen updating the coefficient that is required when setting the coefficient or when compensating for dynamic waveform distortion becomes a main factor which significantly hinders the high-precision and stable compensation operation.

Subsequently, an experimental result of the equalizing filter circuit according to this example will be described hereinafter.

Figure 9A:
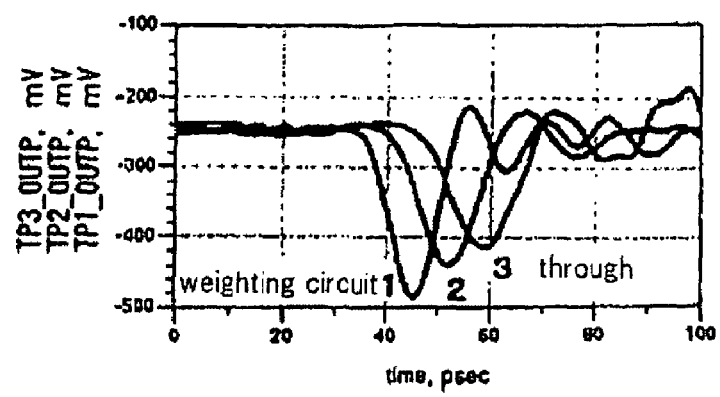
FIG. 9A is a diagrammatic view illustrating an output response of the equalizing filter circuit according to the first example of the present invention.
Figure 9B:
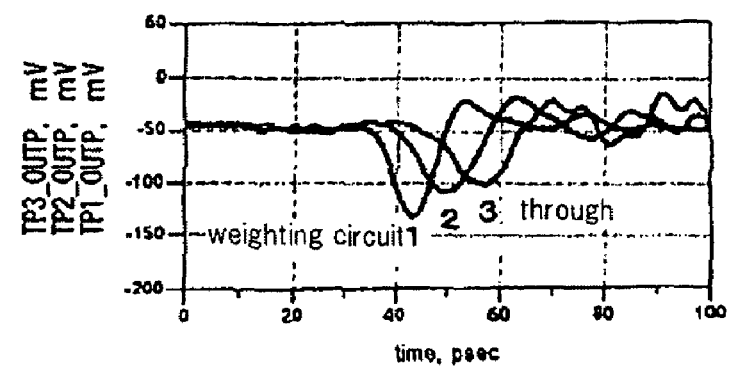
FIG. 9B is a diagrammatic view illustrating an output response of the equalizing filter circuit according to the first example of the present invention.

FIGS. 9A and 9B are graphs illustrating response output waveforms according to the input of pulse waveforms by an arbitrary coefficient value in the equalizing filter circuit of this example. The graphs shown in FIGS. 9A and 9B represent the response output waveforms of the first to third weighting circuits at the side adjacent to the filter input terminal. Also, in the measurements shown FIGS. 9A and 9B, the delay time of the delay devices between the respective weighting circuits is set to be ¼ of the pulse width time of the input pulse waveforms similarly to the case of FIGS. 8A and 8B.

FIG. 9A shows pulse response waveforms passing through the respective weighting circuits in which the setting of the coefficients is the same as the setting in the case of FIG. 8A. It can be seen from the graphs shown in FIG. 9A that response waveforms in which ringing is relatively sufficiently suppressed are realized as compared to the graph shown in FIG. 8A. This means that a mismatch between the transmission line characteristics set in the delay devices and the output characteristics of the weighting circuits is corrected by the variable adjusting circuit.

FIG. 9B is a graph illustrating pulse response waveforms passing through the respective weighting circuits in which the values of coefficients were set by determined values that are different from the determined values in FIG. 9A. It can be seen from the graphs shown in FIG. 9B that despite fluctuation of the output characteristics of the weighting circuits, the pulse response waveforms are very stable. A significant waveform distortion that occurs in the equalizing filter circuit as shown in FIG. 2 is remarkably improved in terms of the response of the waveforms, the delay time of each waveform, and the ringing characteristics.

Like this, according to the equalizing filter circuit according to this example, it is possible to obtain significant effects in which fluctuation of the delay time of the delay devices or an impedance mismatch can be suppressed. Thus, stable and high-precision compensation control for signal waveform distortion is enabled and adaptive equalization according to the dynamic waveform distortion is very easily carried out.

Meanwhile, the variable adjusting circuits are arranged at the output side of all the weighting circuits in this example, but the variable adjusting circuit may be arranged only at the output side of the weighting circuit in which there occurs greater fluctuation of the output load according to the difference of the coefficients that were set so as to adjust the output load.

The Second Example

In this example, the capacitance elements included in the delay devices are configured as parts of the variable adjusting circuits.

The configuration of the equalizing filter circuit according to this example will be described hereinafter.

In the meantime, the same elements as those in the configuration shown in FIG. 3 are denoted by the same reference numerals, and a detailed description of the configuration will be omitted.

Figure 10:
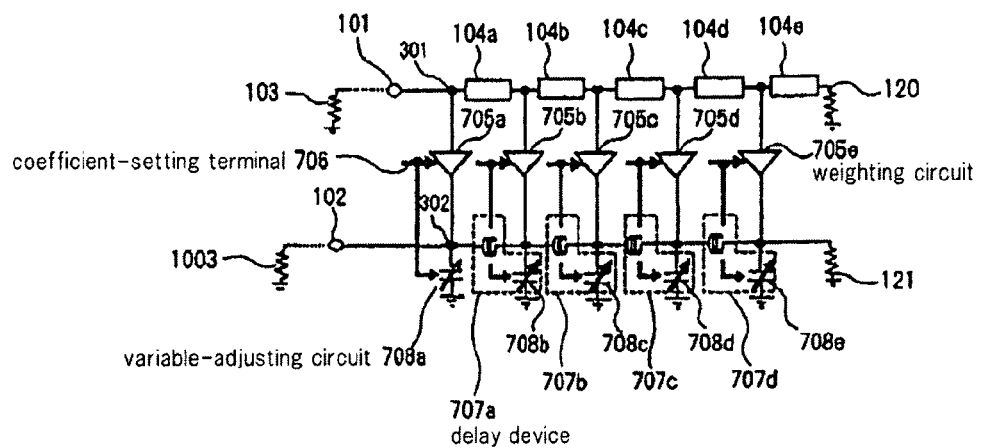
FIG. 10 is a circuit block diagram illustrating a configuration of an equalizing filter circuit according to a second example of the present invention.

FIG. 10 is a circuit block diagram illustrating a configuration of an equalizing filter circuit according to a second example of the present invention.

As shown in FIG. 10, the equalizing filter circuit according to the second example of the present invention includes a plurality of delay devices 104a to 104e connected in cascade to filter input terminal 101, a plurality of weighting circuits 705a to 705e having an adjustable gain, and a plurality of delay devices 707a to 707e connected in cascade to filter output terminal 102. Each of the weighting circuits is provided with coefficient-setting terminal 206 for setting the value of a weighting coefficient.

Each of delay devices 707a to 707d includes a spiral inductor as an inductor element and a varactor element as a variable capacitance element. Each of variable adjusting circuits 708a to 708e including the varactor element is connected to each output side of weighting circuits 705a to 705e. In this manner, in the second example of the present invention, the capacitance elements of the delay devices are configured as parts of the variable adjusting circuits.

Figure 11:
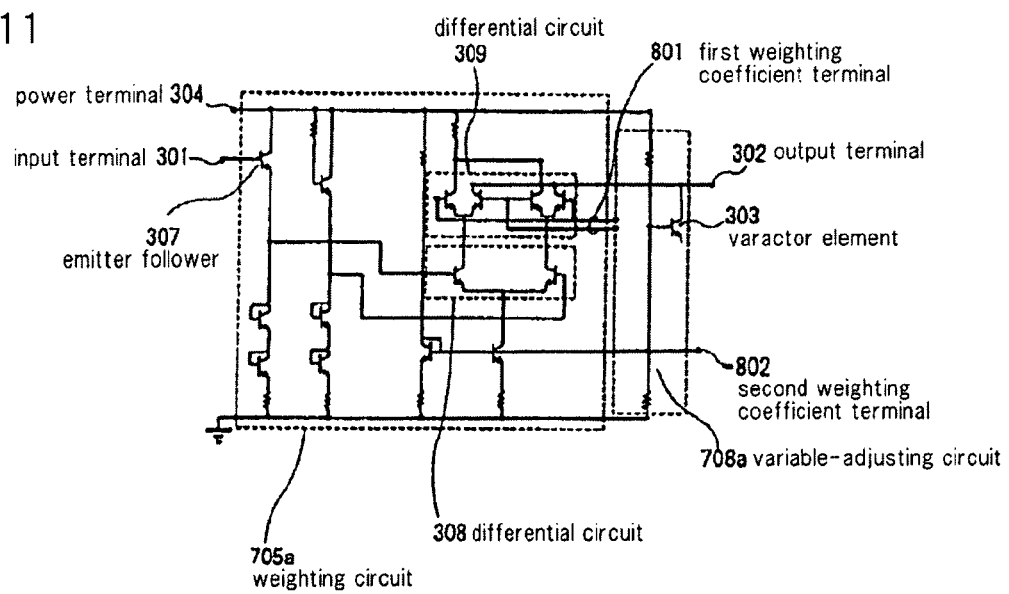
FIG. 11 is a circuit diagram illustrating an example of a configuration of a weighting circuit and a variable adjusting circuit in the equalizing filter circuit according to the second example of the present invention.

FIG. 11 is a circuit diagram illustrating an example of a configuration of a weighting circuit and a variable adjusting circuit in the equalizing filter circuit according to the second example of the present invention.

In this example, weighting circuits 705a and variable adjusting circuit 708a are described as representative examples of weighting circuits and the variable adjusting circuit.

As shown in FIG. 11, weighting circuit 705a includes emitter follower 307, and differential circuits 308 and 309 connected in cascade. Variable adjusting circuit 708a includes varactor element 303. Input terminal 301 is connected to a transmission line of filter input terminal 101 side, and output terminal 302 is connected to the transmission line having filter output terminal 102.

Coefficient-setting terminal 706 shown in FIG. 10 corresponds to first weighting coefficient terminal 801 and second weighting coefficient terminal 802. Weighting circuit 705a adjusts the gain of an amplifier for a weighting coefficient value inputted from second weighting coefficient terminal 802, and adjustment control circuit 210 corrects the output characteristics of the weighting circuits to adjust the output load of the weighting circuits. In cases where the weighting coefficient value inputted from second weighting coefficient terminal 306 increases the gain of the amplifier, variable adjusting circuit 708a controls varactor element 303 to decrease the output load of the weighting circuits. On the other hand, in cases where the weighting coefficient value inputted from second weighting coefficient terminal 306 decreases the gain of the amplifier, variable adjusting circuit 708a controls varactor element 303 to increase the output load of the weighting circuits.

In the second example, a variable adjusting circuit for adjusting the capacitance values of the capacitance elements as parts of the delay devices is provided. Also, the variable adjusting circuit adjusts the output load of the weighting circuits to suppress the fluctuation of the output characteristics of the weighting circuits in response changing the coefficient of the weighting amplifiers. The equalizing filter can obtain significant effects in which the variable adjusting circuit performs the operation of canceling a fluctuation of the output load of the amplifier that occurs when the coefficient of the amplifier of the weighting circuit is changed, so that change in the delay time of the delay devices or impedance mismatching can be suppressed. As a result, stable and high-precision compensation control for signal waveform distortion is realized, and adaptive equalization according to the dynamic waveform distortion is very easily carried out.

Subsequently, the effects of the equalizing filter circuit of this example will be described.

Figure 12:
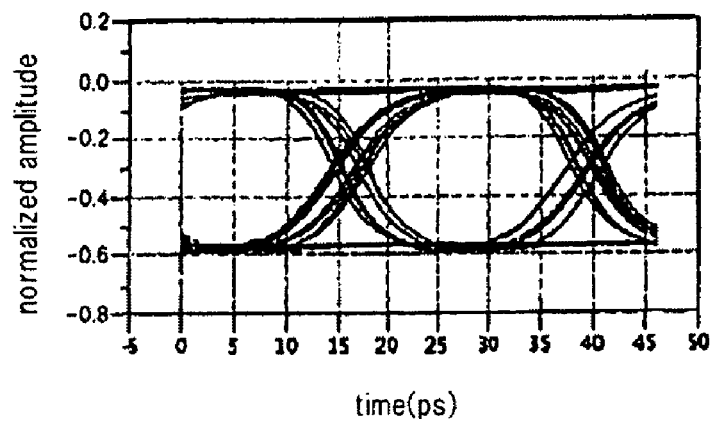
FIG. 12 is a diagrammatic view illustrating waveforms after compensation for waveform distortion by the equalizing filter circuit according to the second example of the present invention.
Figure 13:
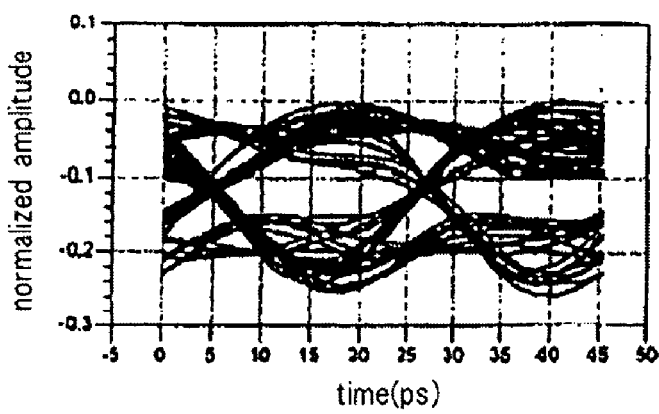
FIG. 13 is a diagrammatic view illustrating waveforms after compensation for waveform distortion by an associated transversal filter.

FIG. 12 is a graph illustrating waveforms after compensation for waveform distortion by the equalizing filter circuit shown in FIG. 10, and FIG. 13 is a graph illustrating waveforms after compensation for waveform distortion by an associated transversal filter circuit. The abscissa denotes time and the ordinate denotes normalized amplitude. What can be seen from the compensation results of distorted waveforms is that stable and high-precision compensation control for signal waveform distortion over a wider range is realized. Accordingly, a distortion compensation range in which the distorted waveforms are compensable without any error can increase up to more than 15%.

Meanwhile, the variable adjusting circuits are arranged at the output side of all the weighting circuits in this example, but the variable adjusting circuit may be arranged only at the output side of the weighting circuit in which there occurs greater fluctuation of the output load according to the difference of the coefficients set so as to adjust the output load.

The Third Example

The configuration of the equalizing filter circuit according to this example will be described hereinafter. In the meantime, the same elements as those in the configuration shown in FIG. 3 are denoted by the same reference numerals, and its detailed description will be omitted.

Figure 14:
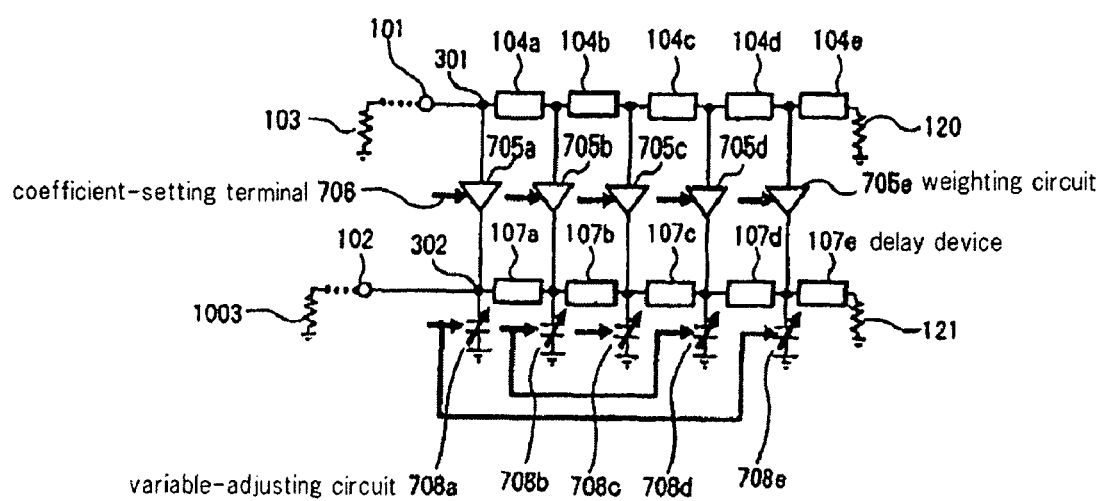
FIG. 14 is a circuit block diagram illustrating a configuration of an equalizing filter circuit according to a third example of the present invention.

FIG. 14 is a circuit block diagram illustrating a configuration of an equalizing filter circuit according to a third example of the present invention.

As shown in FIG. 14, the equalizing filter circuit according to the third example of the present invention includes a plurality of delay devices 104a to 104e connected in cascade to filter input terminal 101, a plurality of weighting circuits 705a to 705e having an adjustable gain, and a plurality of delay devices 707a to 707e connected in cascade to filter output terminal 102.

Each of variable adjusting circuits 708a to 708e including the varactor element is connected to each output side of weighting circuits 705a to 705e. Each variable adjusting circuit includes coefficient-setting terminal 706.

In addition, weighting circuits 705a to 705e and variable adjusting circuits 708a to 708e are configured in the same manner as that in FIG. 11, and hence its detailed description will be omitted. Also, in this example, five taps of the filter are provided, as shown in FIG. 14.

In the equalizing filter circuit in this example, the weighting coefficient values inputted from coefficient-setting terminals 706 of amplifiers of the weighting circuits are set as follows. The weighting coefficient values of the weighting circuits are set symmetrically with respect to the central portion of the cascaded weighting circuits. That is, two coefficient values of a first weighting circuit 705a positioned first from the input side and fifth weighting circuit 705e positioned last from the input side are made equal to each other, and also, two coefficient values of second weighting circuit 705b and fourth weighting circuit 705d are made equal to each other.

By setting the coefficient values in this manner, it is possible for the equalizing filter circuit according to this example to compensate for the waveform distortion caused by the restriction of the frequency band of a transmission medium. In this case, the respective variable adjusting circuits control the output load of the weighting circuits in response to a change in the coefficient values set in the weighting circuits so that the amount of the fluctuation of the output characteristics of the weighting circuits which is corrected by the plurality of variable adjusting circuits connected to the output sides of the respective weighting circuits is set symmetrically with respect to central weighting circuit 705c.

In this example, the output load of the weighting circuits is controlled in the above manner, so that the operation of canceling a fluctuation of the output load of the amplifiers that occurs upon the change of the coefficient of the additional amplifier can be performed. As a result, the equalizing filter can obtain significant effects in which a change in the delay time of the delay devices or impedance mismatching can be suppressed. The equalizing filter circuit of this example can increase the distortion compensation range in which the distorted waveforms are compensable without any error up to more than 15% as well as can reduce the time spent for setting the coefficients up to more than 20%.

In the meantime, although there have been described the variable adjusting circuits shown in FIG. 11 in this example, they may be applied to the equalizing filter circuit illustrated in FIG. 4. Also, delay devices 107a to 107e may be replaced with delay devices 707a to 707e of the second example.

In the foregoing examples, although the description has thus far been about emitter follower circuits, exclusive OR circuits, differential amplifiers and amplifiers, all of which are constructed using bipolar transistors, any other semiconductor devices, for example, such as field effect transistors (FETs) and MOS transistors, may be adopted to constitute source follower circuits, exclusive OR circuits, differential amplifiers, amplifiers and complementary circuits.

Also, in the foregoing examples, although the description has thus far been mainly about a circuit configuration in which an input/output signal is a single-phase signal, the input and output terminals are provided in two pairs even in the case where an input/output signal is a differential signal, to thereby facilitate implementation of a circuit configuration to correspond to the differential signal.

Furthermore, although the description of the present invention has been provided according to the above-described various examples, it is to be noted that the present invention is not limited to the described examples and includes various modifications and variations that could occur to a person having an ordinary skill in the art within the scope of the invention as claimed in the appended claims.

What is claimed is:
1. An equalizing filter circuit comprising:
a first transmission line in which a plurality of first delay devices are connected in cascade to an input terminal;
a second transmission line in which a plurality of second delay devices are connected in cascade to an output terminal;

a plurality of weighting circuits connected in parallel between said first transmission line and said second transmission line and having a gain which is adjustable by setting coefficients; and a variable adjusting circuit arranged at said output side of at least one of said weighting circuits for correcting a fluctuation of output characteristics of said weighting circuits, wherein said variable adjusting circuit receives a coefficient value set in said weighting circuit, and adjusts an amount of correction of a fluctuation of said output characteristics of said weighting circuit in response to a difference in said coefficient value set.

2. The equalizing filter circuit according to claim 1, wherein said variable adjusting circuit decreases an output load of said weighting circuit if said coefficient value increase a gain of said weighting circuit, and increases said output load of said weighting circuit if said coefficient value decrease a gain of said weighting circuit.

3. The equalizing filter circuit according to claim 2, wherein said variable adjusting circuit comprises a variable capacitance element.

4. The equalizing filter circuit according to claim 3, wherein each of said second delay devices comprises an inductor element and said variable capacitance element.

5. The equalizing filter circuit according to claim 2, wherein said variable adjusting circuit is arranged at each of said plurality of weighting circuits, and an amount of correction of said fluctuation of said output characteristics of said weighting circuit, that is corrected by said variable adjusting circuit, is set symmetrically to be equal with respect to a central weighting circuit of a row of said plurality of weighting circuits.

6. The equalizing filter circuit according to claim 1, wherein said variable adjusting circuit comprises a variable capacitance element.

7. The equalizing filter circuit according to claim 6, wherein each of said second delay devices comprises an inductor element and said variable capacitance element.

8. The equalizing filter circuit according to claim 1, wherein said variable adjusting circuit is arranged at each of said plurality of weighting circuits, and an amount of correction of said fluctuation of said output characteristics of said weighting circuit, that is corrected by said variable adjusting circuit, is set symmetrically to be equal with respect to a central weighting circuit of a row of said plurality of weighting circuits.

9. An equalizing filter circuit comprising:
a first transmission line in which a plurality of first delay devices are connected in cascade to an input terminal;
a second transmission line in which a plurality of second delay devices are connected in cascade to an output terminal;
a plurality of weighting circuits connected in parallel between said first transmission line and said second transmission line and having a gain which is adjustable by setting coefficients; and a variable adjusting circuit arranged at said output side of at least one of said weighting circuits for correcting a fluctuation of output characteristics of said weighting circuits, wherein said variable adjusting circuit is arranged at each of said plurality of weighting circuits, and an amount of correction of said fluctuation of said output characteristics of said weighting circuit, that is corrected by said plurality of variable adjusting circuits, is set symmetrically to be equal with respect to a central weighting circuit of a row of said plurality of weighting circuits.

10. An equalizing circuit comprising:
a first transmission line in which a plurality of first delay devices are connected in cascade to an input terminal;
a second transmission line in which a plurality of second delay devices are connected in cascade to an output terminal;
a plurality of weighting circuits connected in parallel between said first transmission line and said second transmission line and having a gain which is adjustable by setting coefficients; and a variable adjusting circuit arranged at said output side of at least one of said weighting circuits for correcting a fluctuation of output characteristics of said weighting circuits, wherein said variable adjusting circuit is independently arranged at an output side of each of said weighting circuits, said variable adjusting circuit comprises a variable capacitance element, and each of said second delay devices comprises an inductor element and said variable capacitance element.

11. An equalizing filter circuit comprising:
a first transmission line in which a plurality of first delay devices are connected in cascade to an input terminal;
a second transmission line in which a plurality of second delay devices are connected in cascade to an output terminal;
a plurality of weighting circuits connected in parallel between said first transmission line and said second transmission line and having a gain which is adjustable by setting coefficients; and a variable adjusting circuit arranged at said output side of at least one of said weighting circuits for correcting a fluctuation of output characteristics of said weighting circuits, wherein said variable adjusting circuit is independently arranged at an output side of each of said weighting circuits, said variable adjusting circuit is arranged at each of said plurality of weighting circuits, and an amount of correction of said fluctuation of said output characteristics of said weighting circuit, that is corrected by said variable adjusting circuit, is set symmetrically to be equal with respect to a central weighting circuit of a row of said plurality of weighting circuits.

* * * * *